United States Patent
Zhao

(10) Patent No.: US 8,308,494 B1
(45) Date of Patent: Nov. 13, 2012

(54) UNIVERSAL SERIAL BUS DEVICE

(75) Inventor: Jiang Zhao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/212,185

(22) Filed: Aug. 18, 2011

(30) Foreign Application Priority Data

Jun. 29, 2011 (CN) .......................... 2011 1 0179081

(51) Int. Cl.
*H01R 13/44* (2006.01)
(52) U.S. Cl. ........................................ 439/131; 439/660
(58) Field of Classification Search .................. 439/131, 439/135, 136, 138, 140, 141; 361/731, 737, 361/752, 756
See application file for complete search history.

(56) References Cited

U.S. PATENT DOCUMENTS

| | | | |
|---|---|---|---|
| 7,558,070 B2* | 7/2009 | Kang | 361/752 |
| 7,708,570 B2* | 5/2010 | Ni et al. | 439/131 |
| 7,841,873 B2* | 11/2010 | Zhu et al. | 439/131 |
| 7,894,198 B2* | 2/2011 | Zhu et al. | 361/755 |
| 2008/0220636 A1* | 9/2008 | Champion et al. | 439/131 |
| 2009/0124104 A1* | 5/2009 | Zhu et al. | 439/131 |
| 2009/0275224 A1* | 11/2009 | Ni et al. | 439/131 |
| 2010/0311257 A1* | 12/2010 | Meng et al. | 439/131 |

* cited by examiner

*Primary Examiner* — Edwin A. Leon
*Assistant Examiner* — Harshad Patel
(74) *Attorney, Agent, or Firm* — Altis Law Group, Inc.

(57) ABSTRACT

A USB device includes a hollow main body having an opening, a USB plug, a transition member fixedly connected to the USB plug, and a rotation member. The rotation member includes a rotation button arranged on the hollow main body and a gear wheel arranged in the hollow main body. The gear wheel is fixed to the rotation button. The transition member includes a gear rack engaged with the gear wheel. Under the rotation of the rotation button, the gear wheel is engaged with the gear rack to drive the USB plug to move out of the hollow main body through the opening, or retracted into the hollow main body.

11 Claims, 7 Drawing Sheets

UNIVERSAL SERIAL BUS DEVICE

BACKGROUND

1. Technical Field

The present disclosure relates to Universal Serial Bus (USB) devices, and particularly, to a portable USB device with a protective function for a USB plug.

2. Description of Related Art

U disks are common USB devices, and are very portable. The U disk usually includes a shell and a USB plug protruding from the shell. For protecting the USB plug from damage, there is a cover on the USB plug.

However, due to collisions between the cover and other members (e.g. books, phone, pens, etc) in a bag, the cover easily slides off the USB plug, and the USB plug without the protection of the cover is easily damaged.

Therefore, what is needed is a new USB device that can overcome the described limitations.

DETAILED DESCRIPTION

Embodiments will now be described in detail with reference to the drawings.

Figure 1:
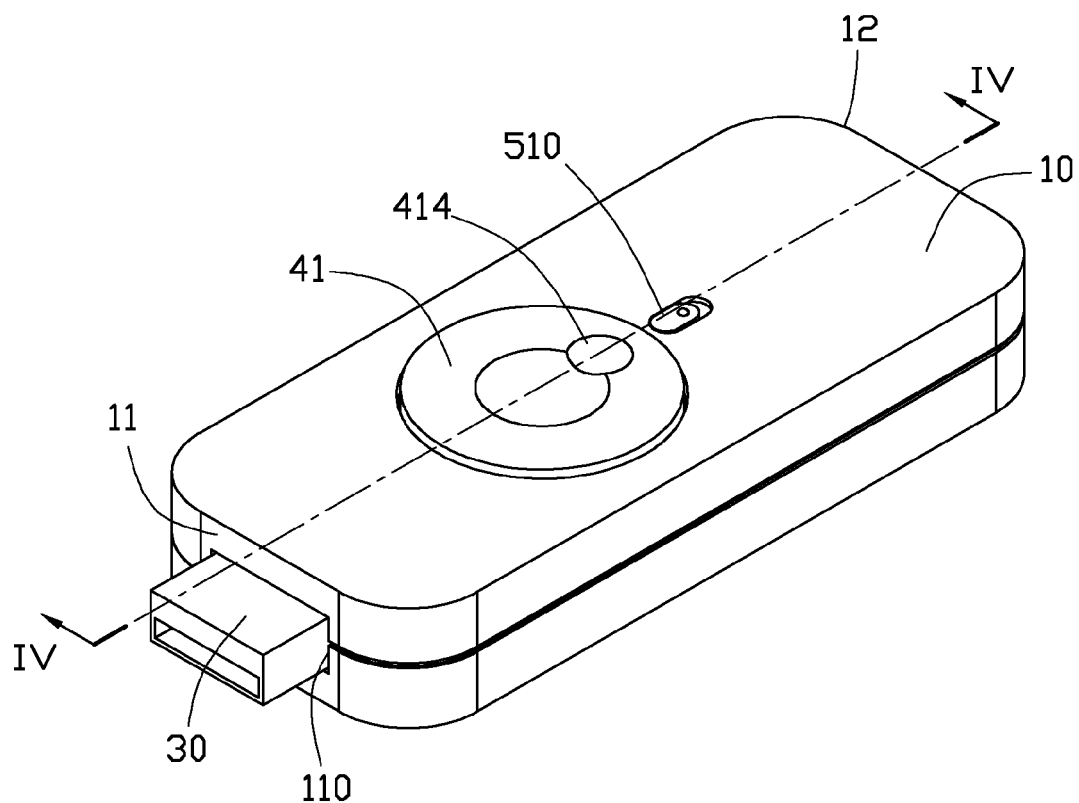
FIG. 1 is an assembled, isometric view of a USB device according to an exemplary embodiment.
Figure 2:
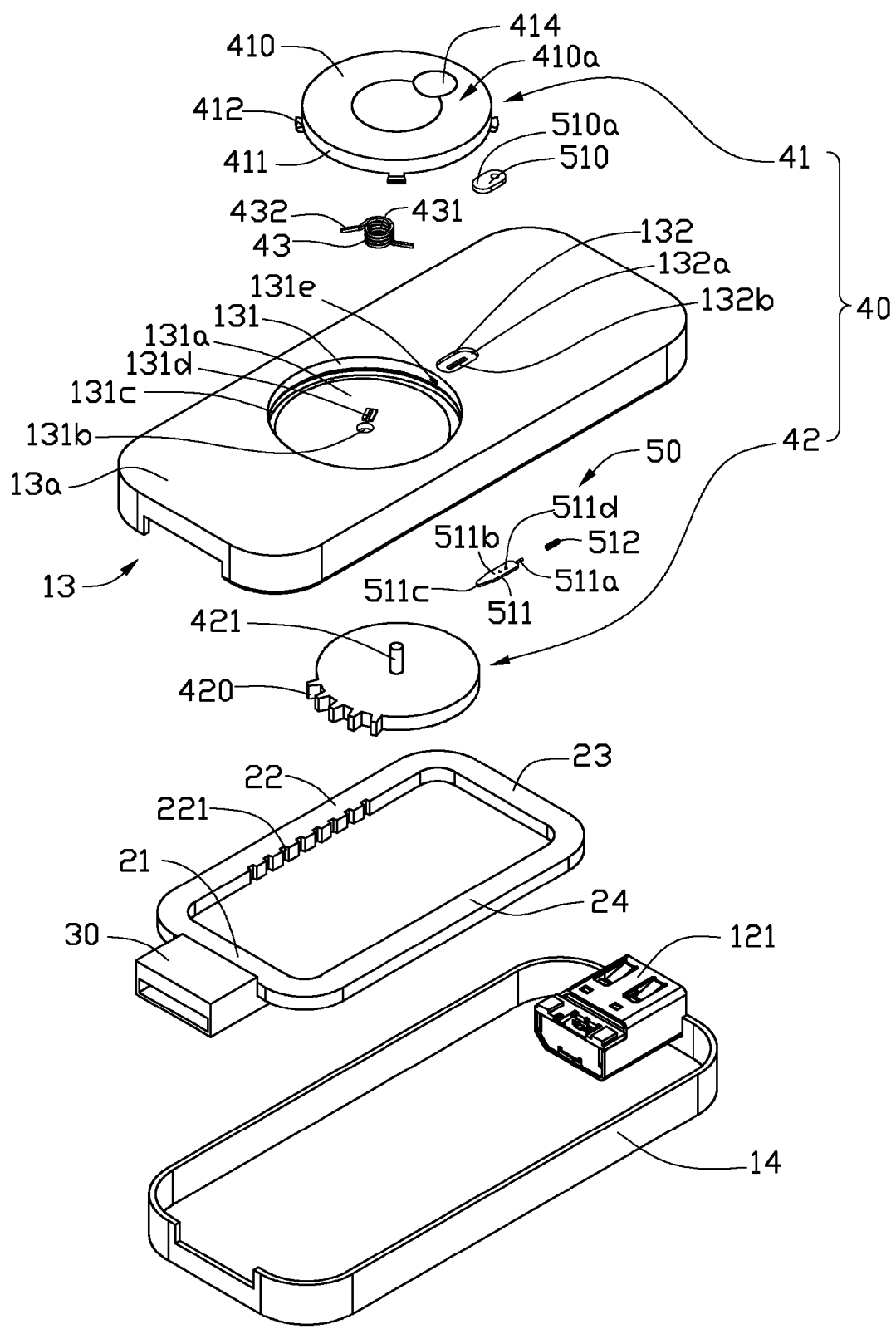
FIG. 2 is an exploded, isometric view of the USB device of FIG. 1.
Figure 3:
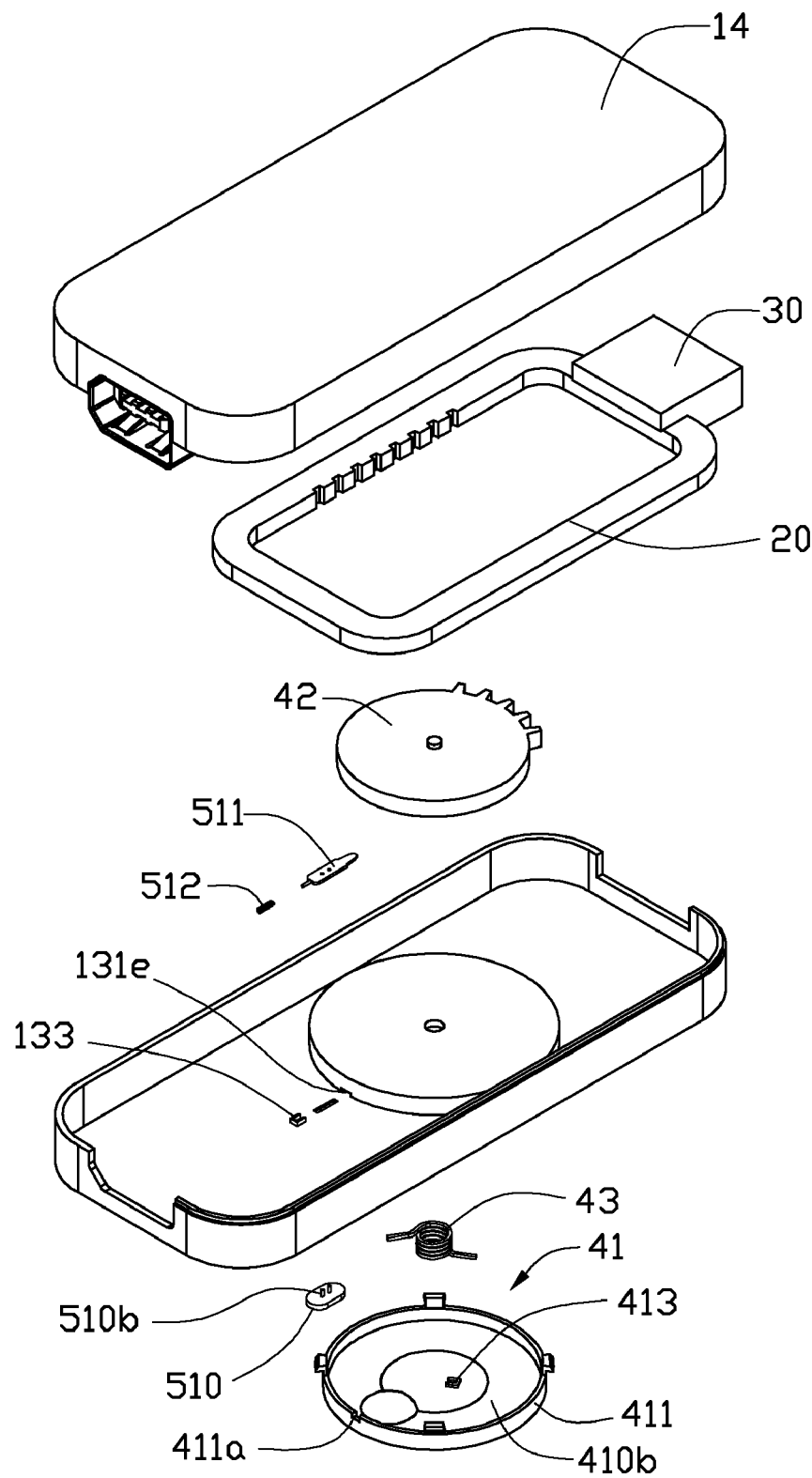
FIG. 3 is similar to FIG. 2, but viewed from the underside.
Figure 4:
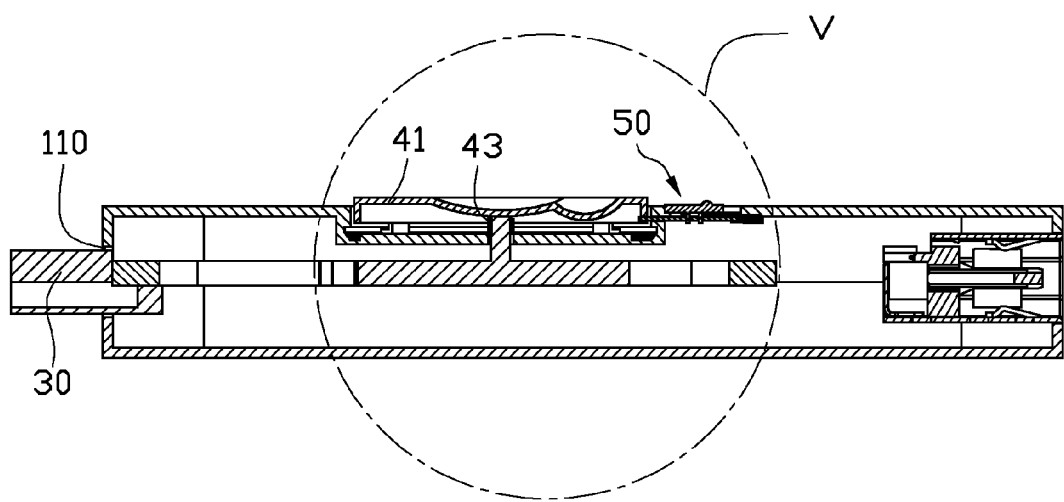
FIG. 4 is a cross-sectional view of the USB device of FIG. 1, taken along line IV-IV.

Referring to FIGS. 1-3, a Universal Serial Bus (USB) device 100, in accordance with an exemplary embodiment, includes a hollow main body 10, a transition member 20, a USB plug 30, a rotation member 40, and a locking member 50. In the present embodiment, the USB device 100 is a U disk. In other embodiments, the USB device 100 may be a USB connector, a USB adapter, a USB headset, or other device with a USB interface.

The hollow main body 10 is a substantially cuboid structure, and includes a first end 11 and a second end 12 opposite to the first end. An opening 110 is defined in the first end 11 for allowing the USB plug 30 to pass through. The hollow main body 10 includes an upper shell 13 latched or otherwise secured to a lower shell 14.

A round recess 131 is defined in an outer surface 13a of the upper shell 13. A through hole 131b is defined in the center of a bottom surface 131a of the round recess 131. A ring-shaped latching groove 131c is defined in the joint between the periphery of the bottom surface 131a of the round recess 131 and a sidewall of the round recess 131. A stopper block 131d is positioned on the bottom surface 131a of the round recess 131, and is near the through hole 131b. A slide groove 132 is defined in the outer surface of the upper shell 13, near the round recess 131. A bar-type slide hole 132b is defined in the bottom 132a of the slide groove 132. A latching hole 131e is defined in the sidewall of the round recess 131, on the longitudinal center-line of the slide groove 132. A stopper frame 133 which is U-shaped in section, but blind, is positioned on the inner surface of the upper shell 13, and is near to an end of the slide groove 132, which is a certain distance from the latching hole 131e. Accordingly, the slide groove 132 is approximately midway between the stopper frame 133 and the latching hole 131e. The opening of the stopper frame 133 is opposite to the slide groove 132. The slide groove 132, the stopper frame 133, and the latching hole 131e are in a line A USB port 121 is arranged on the second end 12. A circuit board (not shown) of the USB device 100 is arranged on the inner surface of the lower shell 14, and is electrically coupled to the USB plug 30 and the USB port 121.

For structural strength, the transition member 20 is a substantially square frame. The transition member 20 is movably arranged in the hollow main body 10. The transition member 20 includes a first sidewall 21 near the first end 11, a second sidewall 22, a third sidewall 23 opposite to the first sidewall 21, and a fourth sidewall 24 opposite to the second sidewall 22. A gear rack 221 is arranged lengthways on the inner surface of the second sidewall 22. In other embodiments, the third sidewall 23 and the fourth sidewall 24 may be omitted (i.e. the transition member 20 may be substantially L shaped).

The USB plug 30 is fixedly connected to the first sidewall 21. In the present embodiment, the USB plug 30 is fixed at the center of the first sidewall 21.

The rotation member 40 includes a rotation button 41, a gear wheel 42 connected to the rotation button 41, and a torsion spring 43.

The rotation button 41 is substantially round, and includes a bottom plate 410, a protruding ring 411 perpendicularly protruding from the periphery of the bottom plate 410, and a plurality of spaced latching portions 412 arranged on the protruding ring 411. A latching notch 411a (see FIG. 3) corresponding to the latching hole 131e is defined in the protruding ring 411. The rotation button 41 is positioned in the round recess 131, such that the latching portions 412 are received in the latching groove 131c and can slide along the latching groove 131c. A U shaped fixed groove 413 (see FIG. 3) is arranged in the inner surface 410b of the bottom plate 410, which is opposite to the bottom surface 131a of the round recess 131. In the present embodiment, there are four latching portions 412 on the protruding ring 411, and they are equally spaced.

For user-friendliness, an operating portion 414 is arranged on an outer surface 410a of the rotation button 410. In the present embodiment, the operating portion 414 is a recessed structure, in other embodiments, the operating portion 414 may be a protruding structure.

The gear wheel 42 is substantially round, and includes a plurality of peripheral gear teeth 420 to engage with the gear rack 221. A protruding post 421 is arranged at the center of the gear wheel 42. The protruding post 421 passes through the through hole 131b, and is fixed to the rotation button 41. The rotation of the gear wheel 42 in the transition member 20 is unimpeded.

The torsion spring 43 includes a hollow cylindrical portion 431 and two spring arms 432 extending from the two ends of the hollow cylindrical portion 431. The hollow cylindrical portion 431 is sleeved over the protruding post 421 (i.e. the protruding post 421 passes through the hollow cylindrical portion 431). One of the spring arms 432 is latched in the fixed groove 413, and the other arm 432 abuts the stopper block 131d, such that the torsion spring 43 is contained between the bottom surface 131a and the rotation button 41 and is placed under torque tension when the rotation button 41 is rotated.

The locking member 50 includes a switch element 510, a latching strip 511, and an elastic element 512. The switch element 510 includes a main body 510a and two fixed posts 510b (see FIG. 5) perpendicularly protruding from the main body 510a. The latching strip 511 includes a cylindrical end 511a, a connection plate 511b, and a latching end 511c opposite to the cylindrical end 511a. Two through holes 511d are defined in the connection plate 511b to correspond with the fixed posts 510b. The fixed posts 510 respectively pass through the slide hole 132b, and are fixed in the through holes 511d by adhesive or other means. The main body 510 is received in the slide groove 132. The spring element 512 is placed over the cylindrical end 511a, and is positioned in the stopper frame 133. The latching end 511c engages with the latching hole 131e and the latching notch 411a, such the position of the rotation button 41 can be fixed. In the present embodiment, the spring element 512 is a spring.

In assembling the USB device 100, the USB plug 30 is firstly fixed on the first sidewall 21, and is positioned in the lower shell 14. The hollow cylindrical portion 431 is placed over the protruding post 421, one of the spring arms 432 is abutted against the stopper block 131d, and the other spring arm 432 is fixed to the rotation button 41 (i.e. latched in the fixed groove 413 of the rotation button 41). Next, the rotation button 41 is positioned in the round recess 131, such that the latching portions 412 are received in the latching groove 131c, and can slide freely along the latching groove 131c. Finally, the fixed posts 510b pass through the slide holes 132b, and are fixed in the through holes 511d, the main body 510a is positioned in the slide groove 132, and the spring element 512 is placed over the cylindrical end 511a and compressed by the stopper frame 133 and the connection plate 511b.

Figure 5:
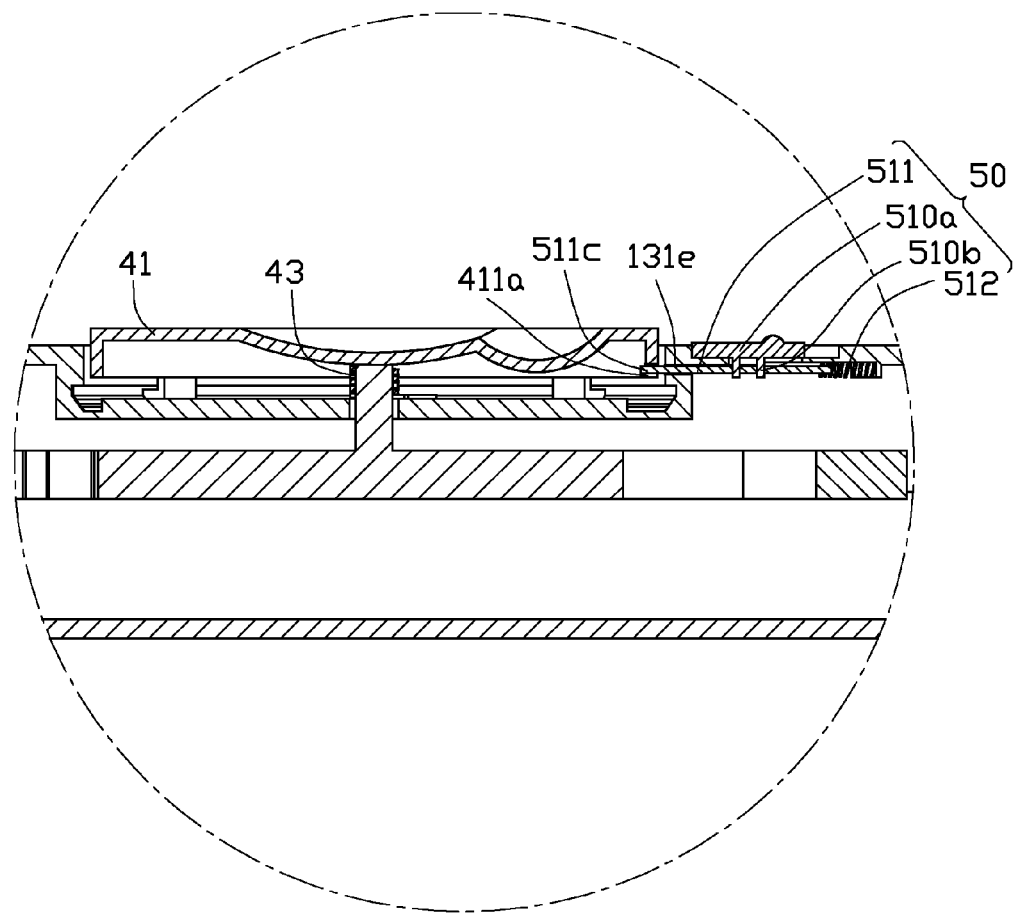
FIG. 5 is an enlarged view of the circled portion V of FIG. 4.

Referring to FIG. 5, when using the USB device 100, the USB plug 30 extends out of the hollow main body 10 through the opening 110. In detail, firstly, the rotation button 41 may be rotated counterclockwise to place the torsion spring 43 under tension. In such a case, the gear teeth 420 drive the transition member 20 forwards until the USB plug 30 is extended out of the hollow main body 10 and the torsion spring 43 is under substantial tension. Meanwhile, the compressed spring 512 drives the latching end 511c to engage with the latching hole 131c and the latching notch 511a, such that the rotation button 41 is locked in that particular position.

Figure 6:
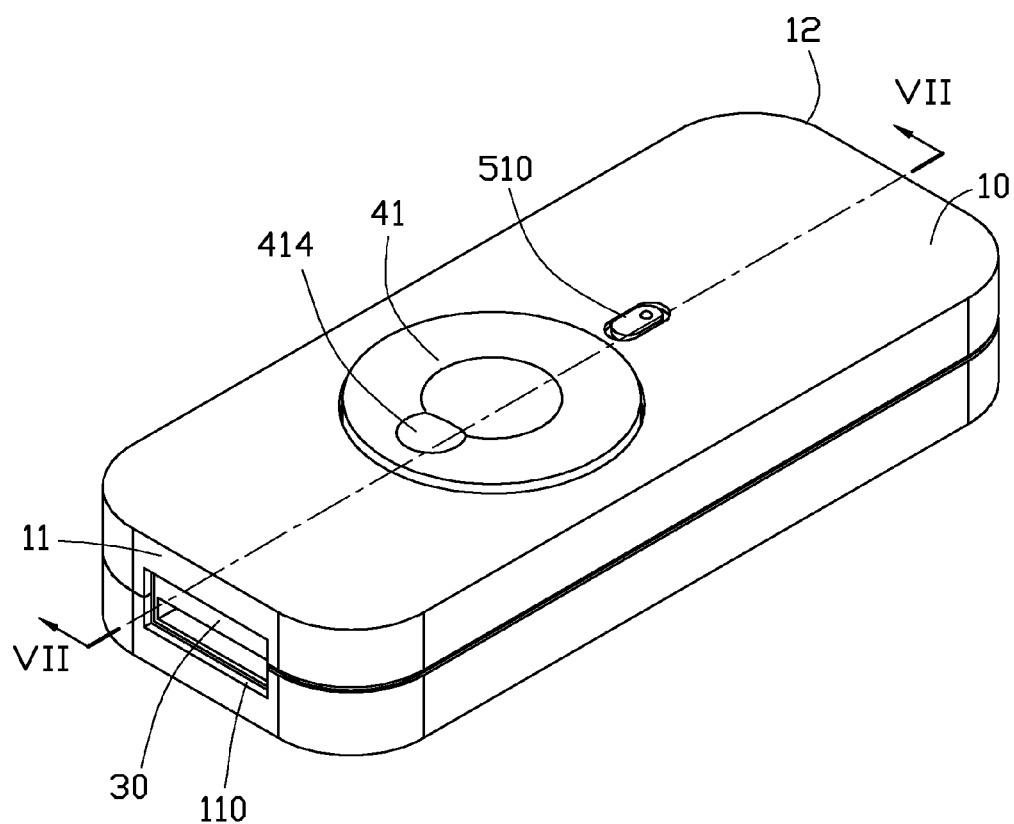
FIG. 6 is an assembled, isometric view of another state of the USB device of FIG. 1.
Figure 7:
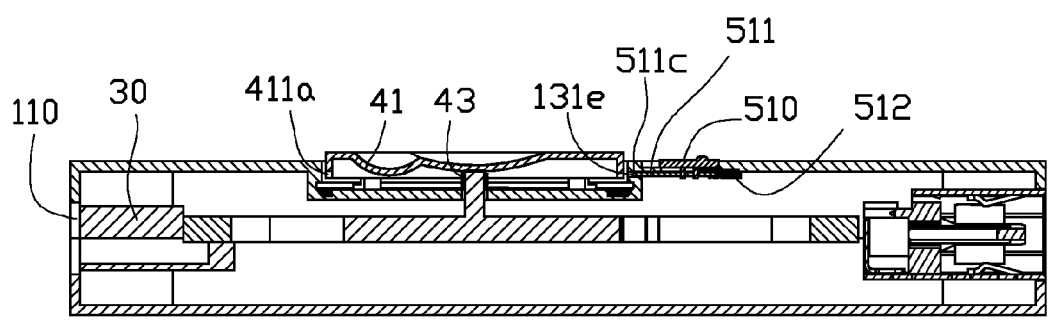
FIG. 7 is a cross-sectional view of the USB device of FIG. 6, taken along line VI-VI.

Referring to FIGS. 6 and 7, when the USB device 100 is not required, the USB plug 30 should retract into the hollow main body 10. In detail, the spring element 512 is compressed further as the switch element 510 is moved away from the latching hole 131e, such that the latching end 511c releases the latching notch 411a. In such a case, the restore force available from the compressed torsion spring 43 drives the rotation button 41 clockwise, and the USB plug 30 is retracted into the hollow main body 10 from the opening 110.

The volume of the USB device 10 can thus be reduced when it is not in use, the USB device 10 is more portable, and the USB plug 30 enjoys greater protection from damage.

While certain embodiments have been described and exemplified above, various other embodiments will be apparent from the foregoing disclosure to those skilled in the art. The disclosure is not limited to the particular embodiments described and exemplified but is capable of considerable variation and modification without departing from the scope and spirit of the appended claims.

What is claimed is:

1. A Universal Serial Bus (USB) device comprising:
    a hollow main body having an opening, the hollow main body comprising an upper shell, a lower shell opposite to and secured to the upper shell, a round recess defined in an outer surface of the upper shell, a ring-shaped latching groove defined at a joint between a periphery of a bottom surface and an inner sidewall of the round recess, and a through hole defined in the bottom surface;
    a USB plug;
    a transition member fixedly connected to the USB plug, the transition member having a gear rack; and
    a rotation member comprising a rotation button arranged on the hollow main body, a gear wheel arranged in the hollow main body, and a protruding post arranged on a center of the gear wheel, the rotation button being positioned in the round recess, the protruding post passing through the through hole of the bottom surface and being fixedly connected to the rotation button, the gear wheel being fixed to the rotation button, and the gear wheel being engaged with the gear rack to drive the USB plug to move out of the hollow main body or retract into the hollow main body from the opening under a rotation of the rotation button;
    wherein the rotation button comprises a plurality of latching portions arranged on a periphery thereof, and the latching portions are received in the ring-shaped latching groove and can slide freely along the ring-shaped latching groove.

2. The USB device of claim 1, wherein the transition member is positioned in the hollow main body, the transition member comprises a first sidewall near the opening and a second sidewall perpendicularly connected to the first sidewall, the USB plug is fixed on the first sidewall, and the gear rack is arranged lengthways on the second sidewall.

3. The USB device of claim 1, wherein the rotation button comprises a bottom plate and a protruding ring perpendicularly protruding from a periphery of the bottom plate, and the latching portions are separately arranged on the protruding ring.

4. The USB device of claim 3, wherein the rotation button further comprises an operating portion arranged on an outer surface of the bottom plate.

5. The USB device of claim 3, wherein the hollow main body further comprises a stopper block arranged on the bottom surface near the through hole of the bottom surface, the rotation button further comprises a fixed groove arranged on an inner surface of the bottom plate, the rotation member further comprises a torsion spring comprising a hollow cylindrical portion and two spring arms on two ends of the hollow cylindrical portion, and the hollow cylindrical portion is placed over the protruding post, such that the torsion spring is positioned between the bottom surface of the round recess and the bottom plate, one of the spring arms is fixed in the fixed groove, and the other spring arm abuts against the stopper block.

6. The USB device of claim 3, wherein the hollow main body further comprises a slide groove arranged on the outer surface of the upper shell, a bar type slide hole defined in a bottom of the slide groove, and a latching hole defined in an inner sidewall of the round recess, the rotation button further comprises a latching notch defined in the protruding ring, the USB device further comprises a locking member, the locking member comprises a switch element slidably arranged in the slide groove, and a latching strip arranged in the hollow main body and fixed to the switch element, and the switch element is configured for bringing the latching strip to pass through the latching hole and the latching notch, thereby positioning the rotation button.

7. The USB device of claim 6, wherein the switch element comprises a main body and at least one fixed post perpendicularly protruding from the main body, the latching strip further comprises a connection plate, and at least one fixed hole corresponding to the at least one fixed post defined in the connection plate, the at least one fixed post passes through the bar type slide hole and is fixed in the at least one fixed hole, and the main body is received in the slide groove.

8. The USB device of claim 7, wherein the locking member further comprises a spring element, the hollow main body further comprises a stopper frame arranged on the inner surface of the upper shell, the latching strip further comprises a cylindrical end and a latching end, the connection plate is positioned between the cylindrical end and the latching end, the spring element is placed over the cylindrical end and arranged in the stopper frame, and the spring element is compressed between the connection plate and the stopper frame and configured to push the latching end to be engaged in the latching hole and the latching notch to fix the rotation button at a position.

9. A Universal Serial Bus (USB) device comprising:
   a hollow main body having an opening, the hollow main body comprising an upper shell, a lower shell opposite to and secured to the upper shell, a round recess defined in an outer surface of the upper shell, and a ring-shaped latching groove defined at a joint between a periphery of a bottom surface and an inner sidewall of the round recess;
   a USB plug;
   a transition member fixedly connected to the USB plug, the transition member having a gear rack; and
   a rotation member comprising a rotation button arranged on the hollow main body and a gear wheel arranged in the hollow main body, the rotation button being positioned in the round recess, the gear wheel being fixed to the rotation button, and the gear wheel being engaged with the gear rack to drive the USB plug to move out of the hollow main body or retract into the hollow main body from the opening under a rotation of the rotation button.

10. The USB device of claim 9, wherein the hollow main body further comprises a through hole defined in the bottom surface of the round recess, the rotation member comprises a protruding post arranged on a center of the gear wheel, and the protruding post passes through the through hole of the bottom surface and is fixedly connected to the rotation button.

11. The USB device of claim 9, wherein the rotation button further comprises a plurality of latching portions arranged on a periphery thereof, and the latching portions are received in the ring-shaped latching groove and can slide freely along the ring-shaped latching groove.

\* \* \* \* \*